United States Patent [19]

Dumonte, deceased

[11] 4,057,746
[45] Nov. 8, 1977

[54] DEMOUNTABLE HIGH POWER ELECTRON BEAM GUN

[75] Inventor: Paul Dumonte, deceased, late of Vitry, France, by Annie Dumonte, administratrix

[73] Assignee: Sciaky Vitry, S. A., Vitry, France

[21] Appl. No.: 699,246

[22] Filed: June 24, 1976

[30] Foreign Application Priority Data

June 23, 1975 France .................... 75.19604

[51] Int. Cl.² .............................................. H01J 1/00
[52] U.S. Cl. .................... 313/237; 313/251; 313/261; 313/285; 313/446
[58] Field of Search ............... 313/243, 261, 251, 236, 313/237, 285, 286, 447, 446

[56] References Cited

U.S. PATENT DOCUMENTS

| | | | |
|---|---|---|---|
| 3,187,216 | 6/1965 | Sciaky | 313/237 |
| 3,354,340 | 11/1967 | Almer et al. | 313/447 |
| 3,449,617 | 6/1969 | Kreuchen et al. | 315/5.34 |
| 3,478,244 | 11/1969 | Meyer et al. | 313/236 X |
| 3,609,400 | 9/1971 | Marks et al. | 313/251 |
| 3,681,643 | 8/1972 | Blatter | 313/261 |

*Primary Examiner*—Saxfield Chatmon, Jr.
*Attorney, Agent, or Firm*—Julius L. Solomon

[57] ABSTRACT

The invention concerns an electron gun for the production of an electron beam designed primarily for welding workpieces and including, in a frame, the mechanical facilities required for holding in a coaxial position and electrically insulating a cathode, a filament, a wehnelt and an anode.

Gun featured by the fact that the cathode is held by mechanical systems in the coaxial position via several rods made of conductive material, one end of these rods being rigidly fixed with respect to the frame, the other end being applied against the outer wall of the disc shaped cathode, thus forming a positioning clamp for said cathode.

The structure allows for the efficient cooling of the internal parts of the gun.

12 Claims, 4 Drawing Figures

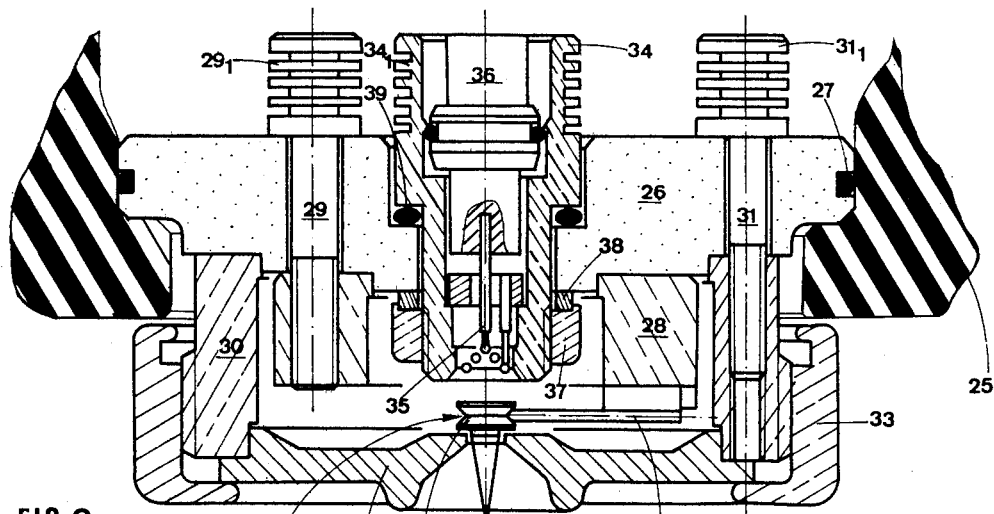
FIG.2
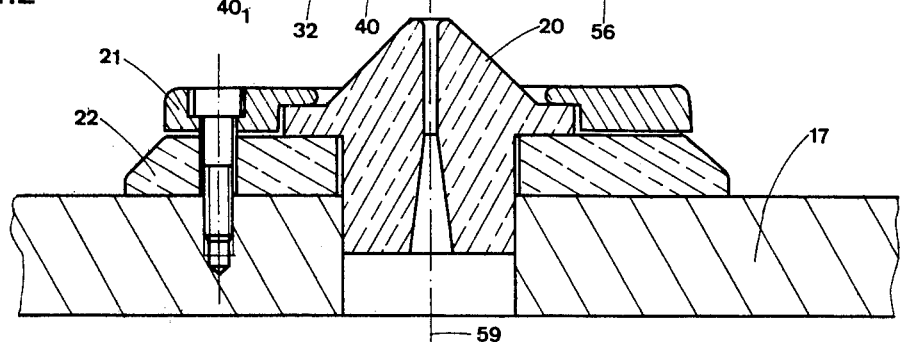
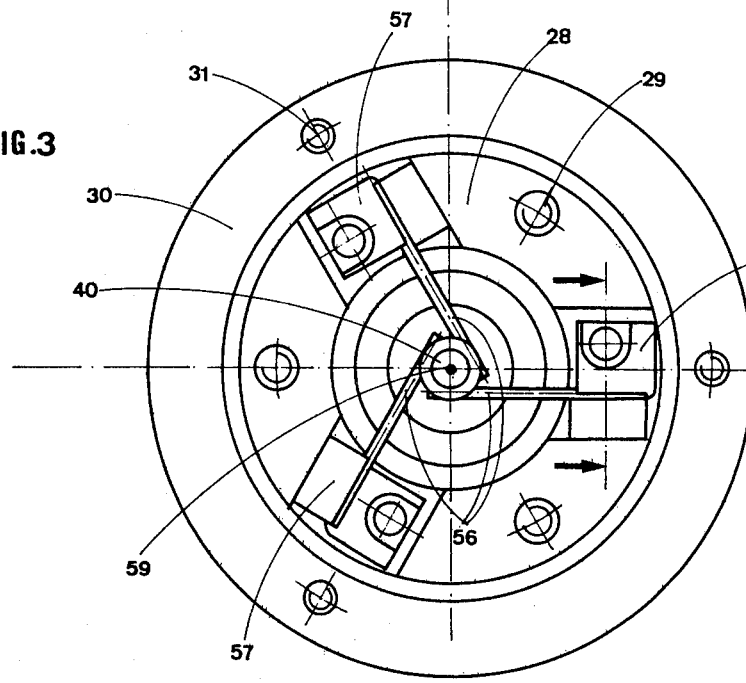
FIG.3
FIG.4

DEMOUNTABLE HIGH POWER ELECTRON BEAM GUN

The invention deals with an electron gun designed to generate an electron beam, primarily for welding workpieces.

The advantages of the electron beam process for buttwelding of thick plates employed in the manufacture of pressure vessels are well known for they permit, in particular, and contrary to other processes, the production of such bonds with a limited number of passes. It was thus found that two 200 mm thick plates could be butt-welded in one single pass with an electron gun capable of delivering a concentrated electron beam of 100 KW power.

These types of electron guns are well known and usually designed to operate at an accelerating voltage of 150 kV voltages. The insulation of the active parts of such guns is usually done with conventional techniques, these parts being under complete vacuum; this solution, however, introduces problems related to heat elimination from cathode support or adjacent parts; an alternative solution consists in installing an oil line for cooling purposes.

The drawback of these various solutions is the need for bulky structures which can be accepted with stationary or laboratory facilities but which are not compatible with powerful guns in mobile setups required when the electron beam process is to be applied in heavy boilermaking workshops or on worksites.

Moreover, the mounting means designed to support the cathode, and the shape of the cathodes do not ensure accurate positioning unaffected by heating when powerful guns are involved, thereby resulting in some variations in the parameters during welding.

The present invention basically aims at eliminating the above drawbacks and for that purpose deals with an electron gun designed to generate an electron beam mainly for welding workpieces and including in a frame all the machanical facilities required for holding in a coaxial position and electrically insulating a cathode, a filament, a wehnelt and an anode; a typical feature of the gun is the maintenance — by mechanical systems — of the cathode in the coaxial position via several rods made of conductive material. One end of these rods is rigidly fixed with respect to the frame, the other end being applied against the outer sidewall of the cathode, thus forming a positioning clamp for said cathode.

According to another typical feature of the invention, the rods which support the cathode are rigidly fixed with respect to the frame via the end-plate of an insulator; this plate also supports the filament and the wehnelt through fastening means insulated from one another.

According to another typical feature of the invention, some of the fastening means for the wehnelt, filament and cathode on the insulator end-plate pass through the end-plate and are connected to power feed cables on the surface of the end-plate located opposite to filament, wehnelt and cathode.

According to another typical feature of the invention, the insulator is hollow and the ends of at least some of the means for fastening the cathode, filament and wehnelt to the insulator end-plate are provided with radiator fins protruding inside this hollow portion of the insulator. Means for air circulation between these fins is provided.

As a non-exhaustive example, the invention is shown on the enclosed drawings in which:

FIG. 2 is an enlarged partial sectional view of the active portion of the gun illustrated in FIG. 1.

FIG. 3 is a view from below of the cathode and the means for its support.

FIG. 4 is section A—A of FIG. 3.

Figure 1:
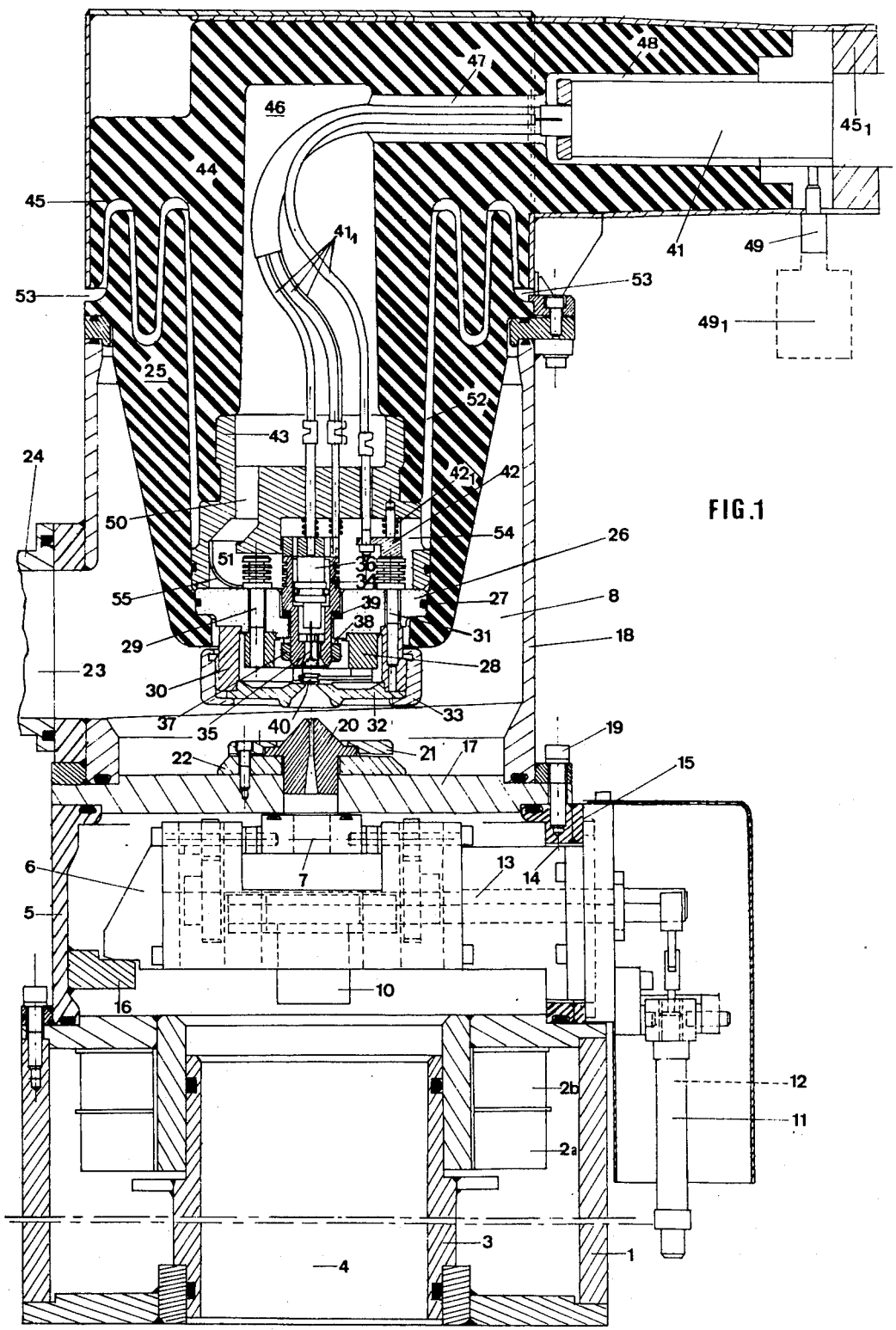
FIG. 1 is a sectional view of a gun manufactured in conformity with the invention.

The present invention primarily aims at a cathode assembly for an electron gun, featured by reduced dimensions and weight and cooled by a system which does not limit the use of the gun to stationary units while ensuring high thermal efficiency, for example a loss of only 750 Watt to heat the cathode required to operate a 100 kW gun.

Referring to FIG. 1, support 1 made of mild steel acts as a reinforcement for focusing coils $2a$ and $2b$ and is made vacuum-tight by part 3 made of stainless steel which provides space 4 for the electron beam to flow.

To support 1 are secured tightly the flange 5 which houses viewing system 6 and valve 7 which closes beam acceleration zone 8 when the work area is put to the atmosphere.

Viewing system 6 is equipped with a prism 10 retracted by air cylinder 11 and a viewing telescope (not shown).

Valve 7 is controlled by cylinder 12. Cylinders 11 and 12 act on prism 10 and valve 7 respectively via rod system 13 so as to remove them from the path followed by the electron beam during gun operation.

Flange 5 has an opening 14 at the right side and the sub-assembly composed of valve 7, prism 10 and the corresponding controls are mounted vacuum tight and removable to the machined face 15. Reaction part 16 permits satisfactory mechanical operation of the above assembly by eliminating the overhang.

Flange 5 is fitted with plate 17 and frame 18 fastened vacuum tight via screws 19. Plate 17 acts as a support for anode 20 in turn secured by flange 21 and spacer 22.

Frame 18 has an opening 23 at the left side for connection to the pumping system via flange 24. This frame has attached to it in a vacuum tight connection insulator 25 made of moulded organic resin.

Insulator 25 acts as a support for end-plate 26 made of refractory oxide with a connection made vacuum tight by seal 27.

On plate 26 are secured emitting cathode 40, cathode support 28 via three vacuum feed throughs 29, support 30 of wehnelt 32 via the 3 vacuum feed through 31, wehnelt 32 held by nut 33 and having a shape suitable for the beam, support 34 of primary filament 35 whose terminals are connected to support 34 on the one hand and to part 36 on the other hand, support 34 being held tight by nut 37 and washer 38 via seal 39 on plate 26.

High voltage is fed via cable 41 composed of four conductors $41_1$ designed to supply the various active parts of the gun, i.e., primary filament heating by 2 conductors, the main connection with one of three terminals 29 of cathode support and connection to the wehnelt through one of the three terminals 31 which support it.

The flexible electrical connections of the four conductors 41 and terminals 42 attached with corresponding terminals 29, 31, 34 and 36 are achieved with the help of springs $42_1$ which are held by organic resin-moulded support 43. This support is fixed onto silicon insulator 44 which forms the insulating socket of the high voltage incoming cable.

Insulator 44 and cable 41 are held integral with each other by metal hood 45 and packing gland 45₁ which permits fastening the high voltage incoming cable on frame 18.

Positioning of cable 41 with respect to insulator 44 defines chamber 46 connected with flange 49 via ducts 47 and 48 and with zone 51 via vent 50 in end-piece 43.

The assembly of hood 45 defines between insulators 44 and 25 a laminar space connected with the atmosphere via vents 53 and with zone 51 via vent 54.

A dry air source 49₁ sends via flange 49 an air stream which flows successively through ducts 48 and 47, chamber 46, vent 50, sweeps zone 51 to cool fins 31₁, 29₁ and 34₁ and through feed throughs 31, 29 and 34 before escaping to the atmosphere via vent 54, spacer 52 and vent 53.

Between vent 50 and zone 51, the air stream is directed by baffle-plate 55.

On FIGS. 3 and 4, cathode 40 proper is shown with its mounting with respect to support 28 which is composed of the three tungsten rods 56 and metal jaws 57 designed to hold rods 56 on support 28 via refractory oxide blocks 58. The assembly can be rotated symmetrically about the gun optical axis 59.

As can be seen on the drawings, cathode 40 includes an annular groove 40₁ in which the three rods 56 are positioned tangentially and spaced one another by 120° for cathode clamping purposes and in order that the cathode touches the rods only at well-determined contact points.

All the features of this gun in conformity with the invention contribute to reduce temperature build-up within cathode associated and/or adjacent parts with a view to reducing gun dimensions and, consequently, to developing mobile welding units.

In addition, these features ensure accurate cathode positioning, unaffected by heating.

The invention is obviously not limited to the above described example of setup, from which other modes and types of setups can be elaborated without exceeding the frame of the invention.

What I claim is:

1. An electron gun for the generation of high power density electron beams adapted to the welding of workpieces comprising:
   means for holding in coaxial position and electrically insulated from one another replacable filament, a wehnelt and anode;
   multiple heat and electricity conducting rod means for maintaining the said cathode in coaxial position, one end of each said rod means being rigidly with respect to the said holding means, the other end of each rod means being applied against the outer side wall of the said replacable cathode so as to form a positioning clamp for the said cathode.

2. An electron gun as in claim 1 in which the filament, the wehnelt, and the rods which support the cathode are rigidly fixed with respect to the first mentioned holding means to the end plate of an insulator by means of fasteners insulated from one another which pass through and are sealed to the said end plate so as to prevent gas leaking between the said fasteners and the end plate.

3. An electron gun conforming to claim 1 in which a cylindrical frame supports a hollow tapered insulator which is formed with an external flange at its largest diameter and an internal flange at the small diameter end; an end plate of insulating material fitted with a sealing means at its periphery and positioned against the said inside flange, the said end plate fitted with fasteners for supporting the said wehnelt, filament, and cathode in fixed relationship and insulated from one another outside the hollow space, the said fasteners passing through the full thickness of the said insulator for connection to the terminal pins of a power feed cable which is supported by a second insulator held concentrically within the hollow of the said first mentioned insulator.

4. A gun according to claim in which the said fasteneers which pass through the end plate are provided with radiator fins protruding inside the hollow portion of the said insulator so that air circulated around the radiator fins may act to remove heat from the fins.

5. An electron gun according to claim 4 in which the said second insulator, at its end, is provided with a support plate containing spring loaded pins which are connected to the power feed conductors, the said pins making elastic electric connection to the cathode, wehnelt and filament fasteners.

6. A gun in accordance with claim 5 above in which the said second insulator forming the plug and supporting the pin support plate fits within the hollow of the said first insulator but in spaced relationship to it so as to form a laminar space between the two insulators for the passage of air to cool the said radiator fins.

7. A gun in accordance with claim 6 in which the rods supporting the cathode are made of tungsten.

8. A gun in accordance with claim 7 in which the said end plate insulator is made of a refractory material.

9. An electron gun according to claim 8 in which the cathode is formed with a peripheral groove in which the rod ends are positioned.

10. An electron gun according to claim 9 including three rods positioned at 120° from one another which support the cathode.

11. An electron gun according to claim 10 in which the rods are positioned tangentially to the cathode peripheral wall.

12. An electron gun according to claim 11 in which the rods are fastened on the said end plate through blocks of refractory material.

* * * * *